(12) United States Patent
Huang et al.

(10) Patent No.: US 6,770,563 B2
(45) Date of Patent: Aug. 3, 2004

(54) PROCESS OF FORMING A BOTTLE-SHAPED TRENCH

(75) Inventors: Tung-Wang Huang, Taipei (TW); Chang Rong Wu, Banchiau (TW); Chien-Mao Liao, Shijr (TW); Hsin-Jung Ho, Shijr (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/336,083

(22) Filed: Jan. 3, 2003

(65) Prior Publication Data

US 2004/0053464 A1 Mar. 18, 2004

(30) Foreign Application Priority Data

Sep. 16, 2002  (TW) .......................................... 91121111 A

(51) Int. Cl.[7] ............................................. H01L 21/311
(52) U.S. Cl. ....................... 438/702; 438/386; 438/424; 438/704
(58) Field of Search .......................... 438/702, 243–249, 438/386–392, 424–438, 704, FOR 227; 257/E21.233

(56) References Cited

U.S. PATENT DOCUMENTS

| | | | |
|---|---|---|---|
| 5,112,771 A | | 5/1992 | Ishii et al. |
| 6,232,171 B1 | * | 5/2001 | Mei ............................. 438/246 |
| 6,486,024 B1 | * | 11/2002 | Tews et al. ................. 438/249 |
| 2002/0014647 A1 | * | 2/2002 | Seidl et al. ................. 257/301 |
| 2002/0072171 A1 | * | 6/2002 | Forster et al. ............. 438/243 |
| 2002/0072198 A1 | * | 6/2002 | Ahn ............................ 438/424 |
| 2003/0036241 A1 | * | 2/2003 | Tews ........................... 438/386 |

* cited by examiner

*Primary Examiner*—George Fourson
(74) *Attorney, Agent, or Firm*—Merchant & Gould P.C.

(57) ABSTRACT

A process of forming a bottle-shaped trench. A semiconductor substrate with a trench is provided, on which a pad layer and hard mask layer are sequentially formed. A dielectric layer is formed on the hard mask layer to fill the trench. Part of the dielectric layer is etched to expose the sidewall of the upper portion of the trench. A spacer is formed on the sidewall. The residual dielectric layer in the trench is removed, and the partial trench not covered by the spacer is etched to a bottle shape.

12 Claims, 11 Drawing Sheets

PROCESS OF FORMING A BOTTLE-SHAPED TRENCH

BACKGROUND OF THE INVENTION

1. Field of the Invention

The invention relates to a semiconductor process, and more particularly to a bottle-shaped trench fabrication process used in dynamic random access memory (DRAM).

2. Description of the Related Art

As the integration density of dynamic random access memory (DRAM) steadily increases, it becomes necessary to reduce the memory cell size. The memory cell size is primarily determined by the minimum resolution dimension of a lithographic technique, the overlay tolerances between the different features, and the layout of these features. At the same time, it is necessary to maintain the minimum required storage capacitance to reliably operate the DRAM. To meet both the cell size and storage capacitance requirements, a trench capacitor was invented, the simple single device/capacitor memory cell being altered to provide the capacitor in a vertical dimension. In such designs, the capacitor is formed in a trench in the surface of the semiconductor substrate.

However, as the size of a DRAM is scaled down by a factor of f (feature size), the trench storage node capacitance decreases by a factor of f. Therefore, it is important to develop methods to increase the storage capacitance. One method employed to increase capacitance is to widen the bottom portion of the trench, thus, increasing the surface area and creating a "bottle shaped" capacitor.

However, in order to space the capacitors closely, control of the etching process used to widen the bottom portion becomes a governing factor. Chemical dry etching is predominantly used to create the bottle-shaped portion of the capacitor. In U.S. Pat. No. 5,112,771 issued to Ishii, et al. on May 12, 1992, entitled, "METHOD OF FABRICATING A SEMICONDUCTOR DEVICE HAVING A TRENCH", the bottom region of a trench capacitor is enlarged. This is accomplished by leaving a silicon oxide film on the upper sidewall of a trench, and enlarging the width of the exposed bottom portion of the trench by anisotropic dry etching. Since the silicon substrate is isotropically dry etched, it is etched not only per pendicular to the surface of the substrate, but also parallel thereto. Although the capacitor surface area is enlarged, such etching processes are not easily controlled.

In FIG. 1, a semiconductor substrate 101 is provided. A pad stack layer 106 is formed on the semiconductor substrate 101. The pad stack layer 106 is formed by chemical vapor deposition (CVD). For example the pad stack layer 106 is a combination of a pad oxide layer 102, a nitride layer 103, and a borosilicate glass (BSG) layer 105. The pad oxide layer 102 is formed on the semiconductor substrate 101. The nitride layer 103 is formed on the pad oxide layer 102. The BSG layer 105 is formed on the nitride layer 103. The pad stack layer 106 is used as a hard mask layer for etching deep trench step. A mask opening 108 is formed in the pad stack layer 106 to expose a portion of the surface of the semiconductor substrate 101.

The exposed semiconductor substrate 101 is etched to form a neck profile 109 using a combination gas of HBr, NF3, and a premixed He/O2 as primary plasma gas. The depth of the neck profile 109 is about 1.2 um.

In FIG. 2, the trench profile 109 is etched to remove the exposed semiconductor substrate to form a bottom profile 110 using the combination gas of HBr, NF3, and premixed He/O2 as a primary plasma gas.

The conventional process of forming the bottle-shaped trench is not easily controlled, and the quality of the capacitor is rarely satisfactory.

SUMMARY OF THE INVENTION

In view of the above disadvantages, an object of the invention is to provide a method of forming a bottle-shaped trench in a semiconductor substrate. According to the method, the capacitor surface area can be efficiently enlarged in a is simpler way; a formation method of bottle-shaped trench for capacitor that is easily controlled.

Accordingly, the present invention provides a process of forming a bottle-shaped trench. A semiconductor substrate is provided. A pad layer and a hard mask layer are all sequentially formed on the surface of the semiconductor substrate. A trench is formed in the semiconductor substrate. A dielectric layer is formed on the surface of the hard mask layer. The trench is filled with the dielectric layer. The dielectric layer in the trench is etched to a predetermined depth. A spacer is formed on the sidewall of the trench. The dielectric layer is removed. The trench, unmasked by the spacer, is etched to a bottle shape.

The present invention also provides another process of forming a bottle-shaped trench. A semiconductor substrate is provided. A pad layer, a hard mask layer, and a patterned insulating layer having an opening exposing the surface of the hard mask layer, are all sequentially formed on the semiconductor substrate. The hard mask layer, the pad layer, and the semiconductor substrate are all sequentially etched to form a trench. The patterned insulating layer is removed. A spin-on glass layer is formed on the surface of the hard mask layer, filling the trench. The spin-on glass layer in the trench is anisotropically etched to a predetermined depth, and the spin-on glass layer on the surface of the hard mask layer is totally removed. An insulating layer is conformally formed on the surface of the hard mask layer and the trench. The insulating layer is anisotropically etched to form a spacer on the sidewall of the trench. The surface of the spin-on glass layer is exposed. The spin-on glass layer is removed by wet etching. The trench, unmasked by the spacer, is isotropically etched to a bottle shape.

The present invention also provides yet another process of forming a bottle-shaped trench. A semiconductor substrate is provided. A pad layer and a hard mask layer are all sequentially formed on the semiconductor substrate. A conformal first liner layer and a conformal second liner layer are all sequentially formed on the surface of the hard mask layer and the trench. A dielectric layer is formed on the surface of the hard mask layer, filling the trench. The dielectric layer in the trench is etched to a predetermined depth. A spacer is formed on the sidewall of the trench. The dielectric layer is removed. The exposed second liner layer is removed. The spacer and the exposed first liner layer are removed. The trench, unmasked by the first liner layer and the second liner layer, is etched to a bottle shape.

Accordingly, the present invention also further provides another process of forming a bottle-shaped trench. A semiconductor substrate is provided. A pad layer, a hard mask layer, and a patterned insulating layer having an opening exposing the surface of the hard mask layer are all sequentially formed on the semiconductor substrate. The hard mask layer, the pad layer, and the semiconductor substrate are all sequentially etched to form a trench. The patterned insulating layer is removed. A conformal first liner layer and a conformal second liner layer are all sequentially formed on the surface of the hard mask layer and the trench. A spin-on glass layer is formed on the surface of the hard mask layer, filling the trench. The spin-on glass layer is etched to a predetermined depth. A conducting layer is conformally formed on the surface of the trench and the spin-on glass layer. The conducting layer in the trench is anisotropically etched to form a spacer. The surface of the spin-on glass layer is exposed. The spin-on glass layer is removed by wet etching. The exposed second liner layer is removed. The spacer and the exposed first liner layer are removed. The trench, unmasked by the first liner layer and the second liner layer, is etched to a bottle shape.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

First Embodiment

FIGS. 3a to 3G are cross-sections of a process of forming a bottle-shaped trench in a first embodiment of the present invention.

Figure 2:
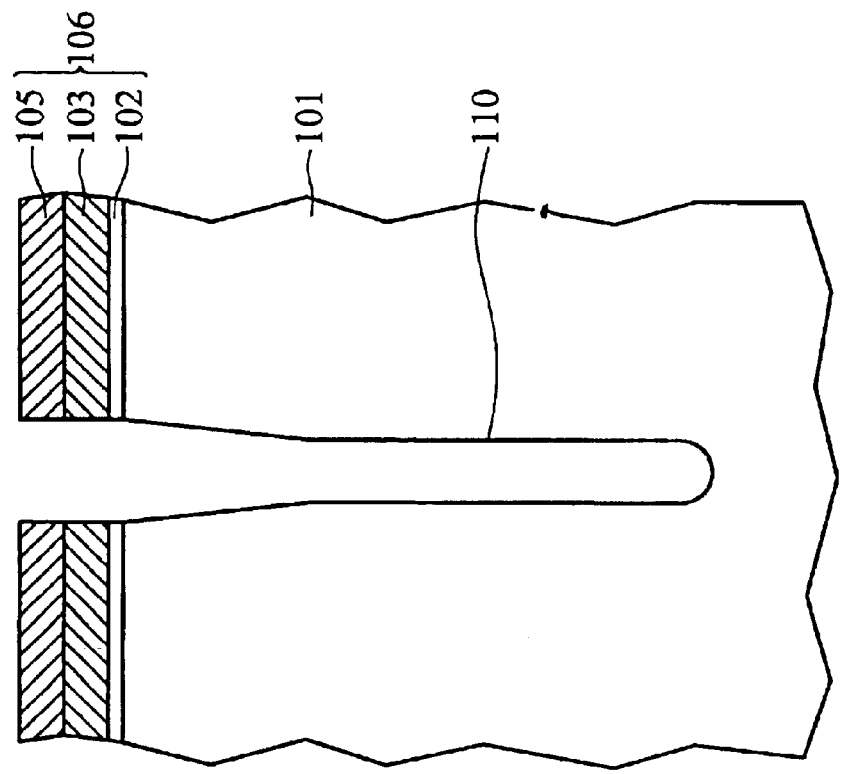
FIG. 2 is a cross-section of the conventional process of forming the bottom profile of the bottle-shaped trench.
Figure 1:
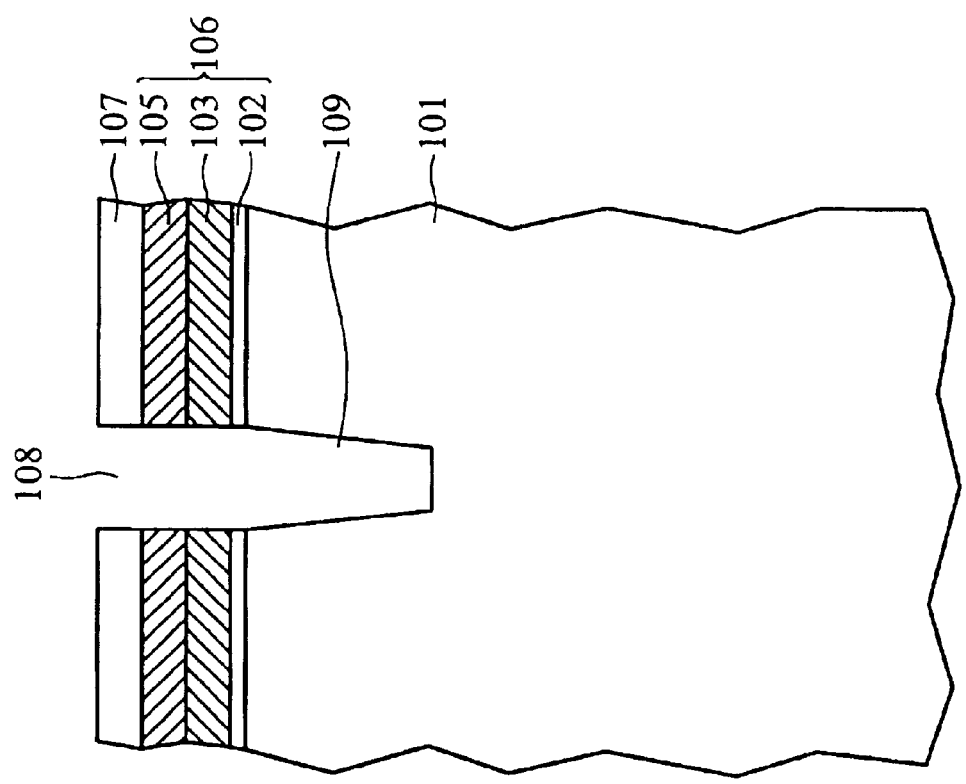
FIG. 1 is a cross-section of the conventional process of forming the neck profile of the bottle-shaped trench.
Figure 3B:
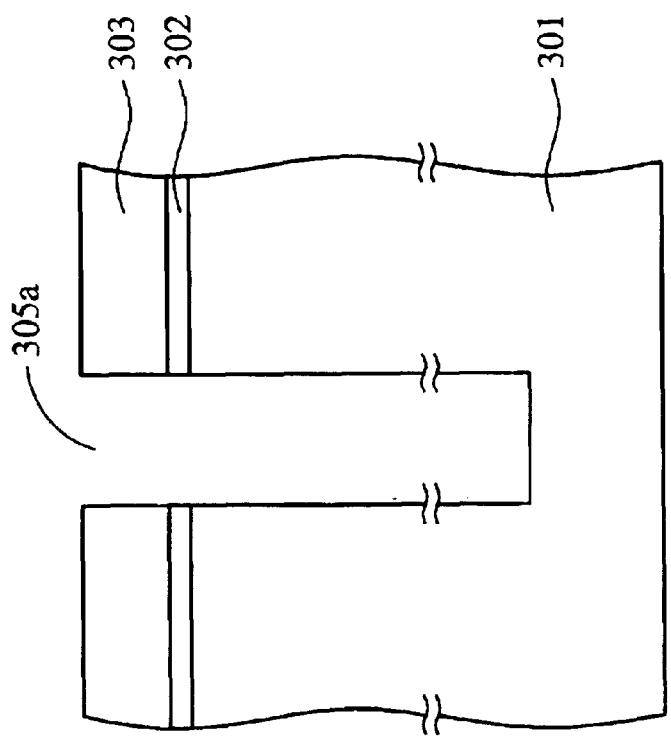
FIGS. 3a to 3g are cross-sections of a process of forming a bottle-shaped trench in a first embodiment of the present invention.
Figure 3A:
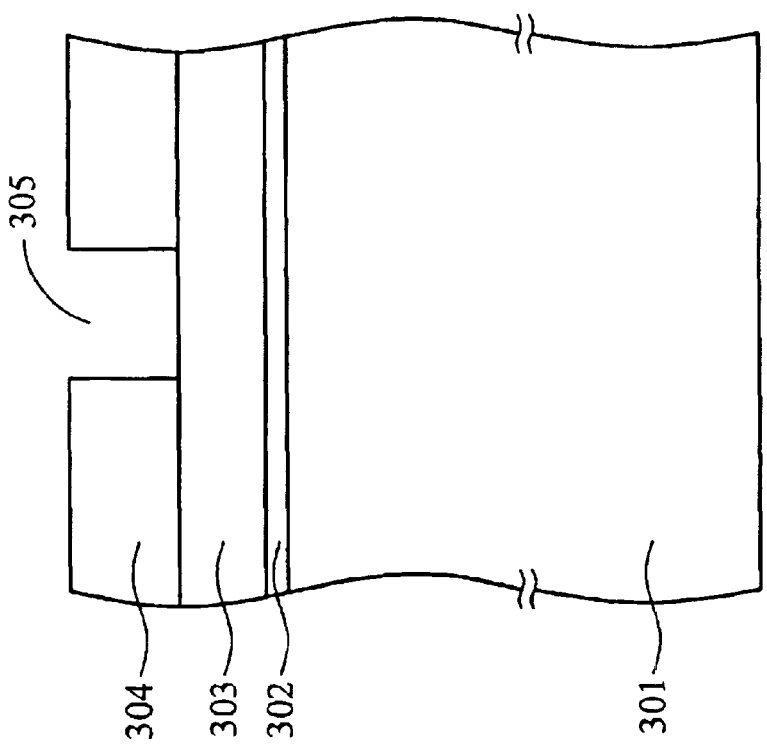

In FIG. 3a, first, a semiconductor substrate 301, such as silicon, is provided. A pad oxide layer 302, a dielectric layer 303, such as nitride, and a hard mask layer 304, such as borosilicate glass, are all sequentially formed on the surface of the semiconductor substrate 301. A patterned resist layer (not shown) having an opening is formed on the surface of the hard mask layer 304. The hard mask layer 304 is etched using the patterned resist layer as a mask to form an opening 305. The patterned resist layer is removed.

The hard mask layer 304 can be nitride, but the combination of the nitride and the borosilicate glass provides higher quality.

In FIG. 3b, the dielectric layer 303, the pad oxide layer 302, and the semiconductor substrate 301 are all sequentially etched to form a trench 305a, and then the hard mask layer 304 is removed.

Figure 3D:
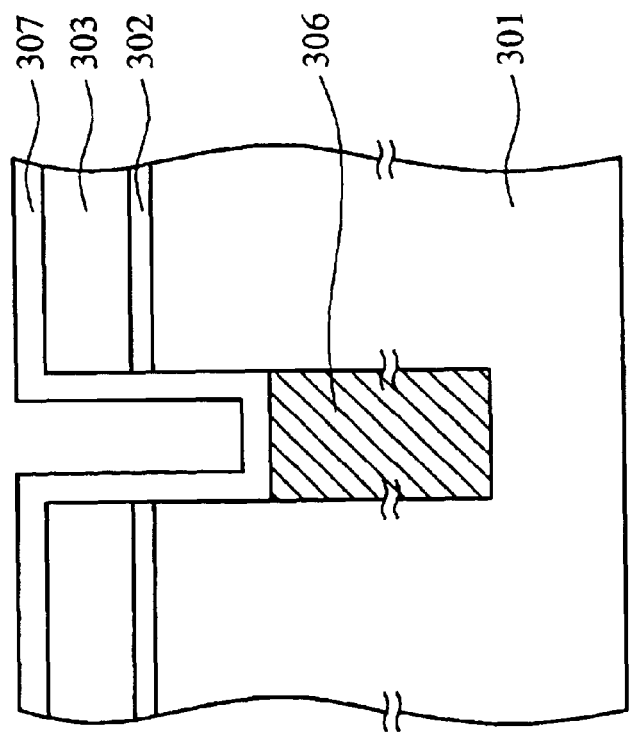
Figure 3C:
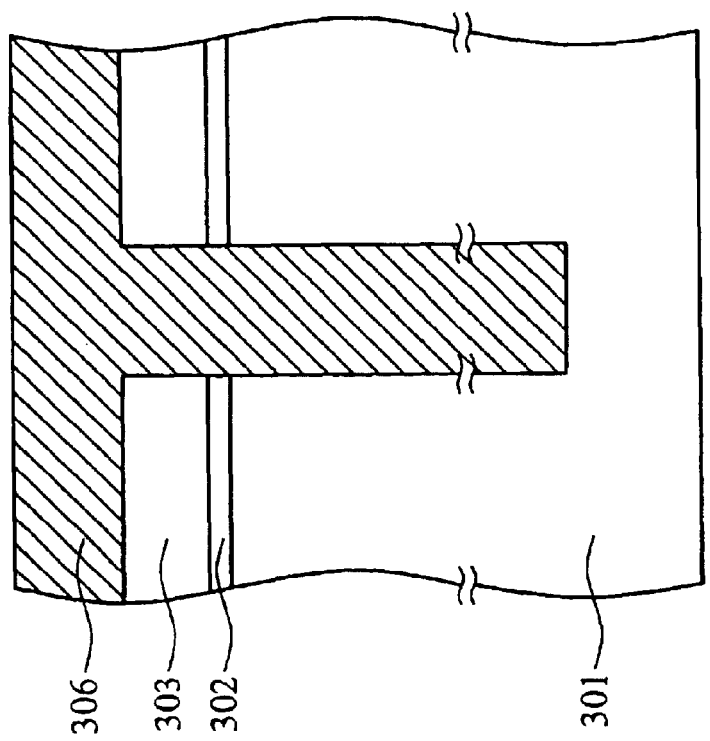

In FIG. 3c, a first insulating layer 306, such as spin-on glass or silicon oxide or borosilicate glass (BSG) or phosphosilicate glass (PSG), is formed on the surface of the surface of the dielectric layer 303, and the trench 305a is filled with the first dielectric layer 306.

In FIG. 3d, the first insulating layer 306 of the surface of the dielectric layer 303 is removed, and the first insulating layer 306 in the trench 305a is etched to a predetermined depth of about 1 to 2 μm. The insulating layer 306 can be removed by anisotropic etching, such as reactive ion etching (RIE) or plasma etching, or isotropic etching, such as wet etching.

A second insulating layer 307, such as oxide or nitride, is conformally formed on the surface of the dielectric layer 303 and the trench 305a. The material of the second insulating layer 307 can be the same as the dielectric layer 303 but different from the first insulating layer 306 when executing the following processes.

Figure 3F:
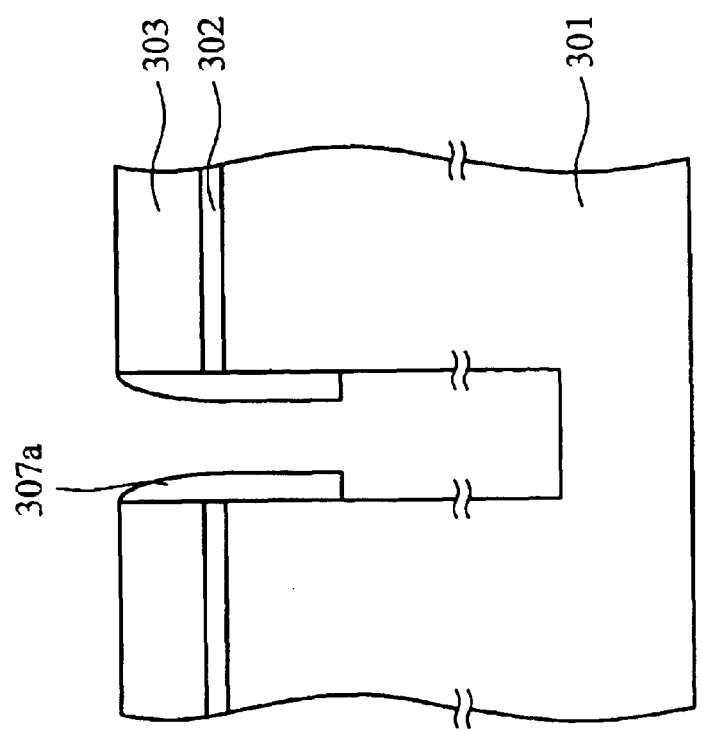
Figure 3E:
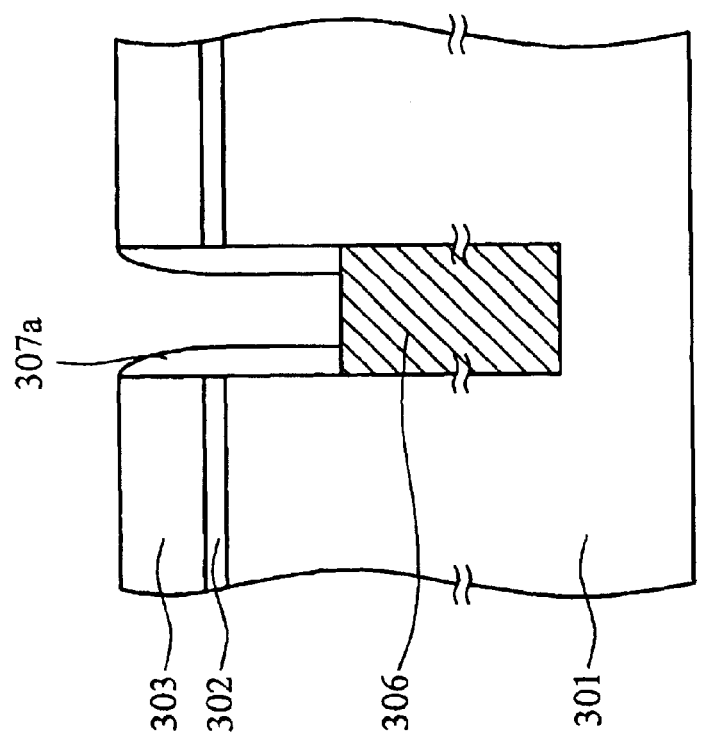

In FIG. 3e, the second insulating layer 307 is anisotropically etched to form a spacer 307a on the sidewall of the trench 305a, and the surface of the first insulating layer 306 in the trench 305a is exposed. The dielectric layer 303 is not damaged because the insulating layer 307 is formed thereon, and the width of the opening of the trench 305a will not increase.

In FIG. 3f, the first insulating layer 306 in the trench 305a is isotropically etched using the spacer 307a as a mask.

Figure 3G:
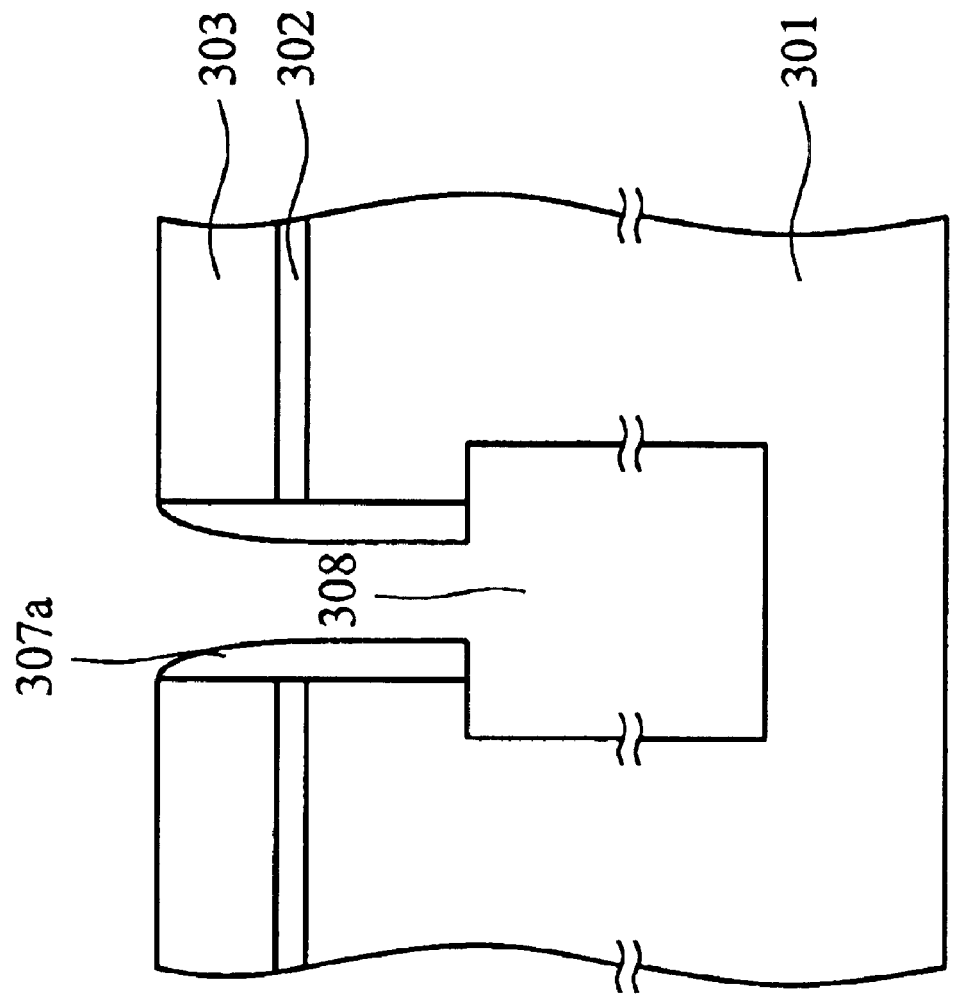

In FIG. 3g, the trench 305a unmasked by the spacer 307a, is isotropically etched to a bottle shape 308.

Second Embodiment

FIGS. 4a to 4k are cross-sections of the process of forming a bottle-shaped trench in a second embodiment of the present invention.

Figure 4B:
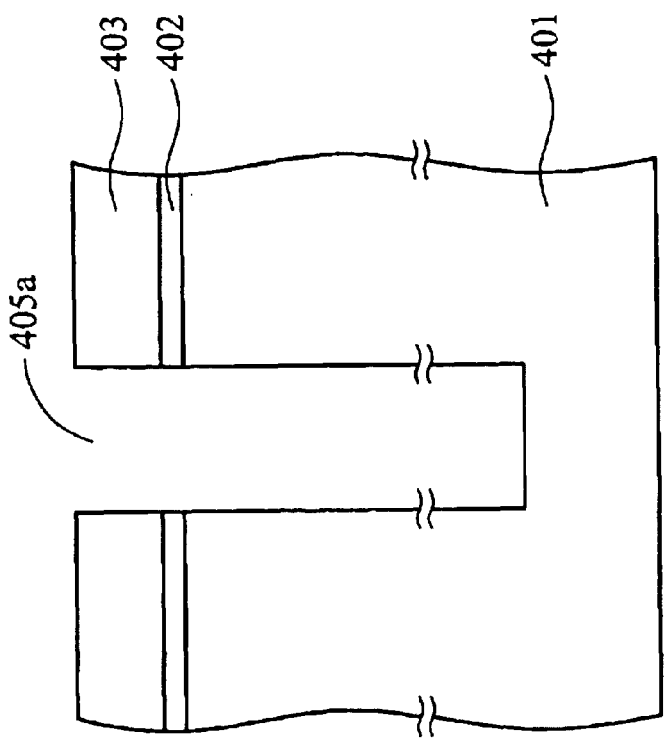
FIGS. 4a to 4k are cross-sections of a process of forming a bottle-shaped trench in a second embodiment of the present invention.
Figure 4A:
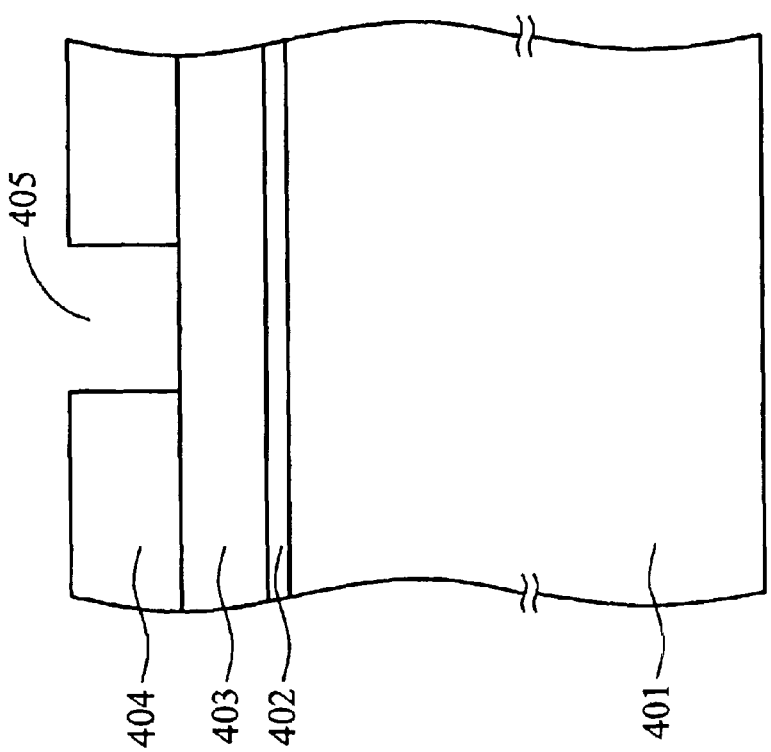

In FIG. 4a, first, a semiconductor substrate 401, such as silicon, is provided. A pad oxide layer 402, a dielectric layer 403, such as nitride, and a hard mask layer 404, such as borosilicate glass, are all sequentially formed on the surface of the semiconductor substrate 401. A patterned resist layer (not shown) having an opening is formed on the surface of the hard mask layer 404. The hard mask layer 404 is etched using the patterned resist layer as a mask to form an opening 405. The patterned resist layer is removed.

In FIG. 4b, the dielectric layer 403, the pad oxide layer 402, and the semiconductor substrate 401 are all sequentially etched using the hard mask layer 404 as a mask to form a trench 405a, and then the hard mask layer 404 is removed.

Figure 4D:
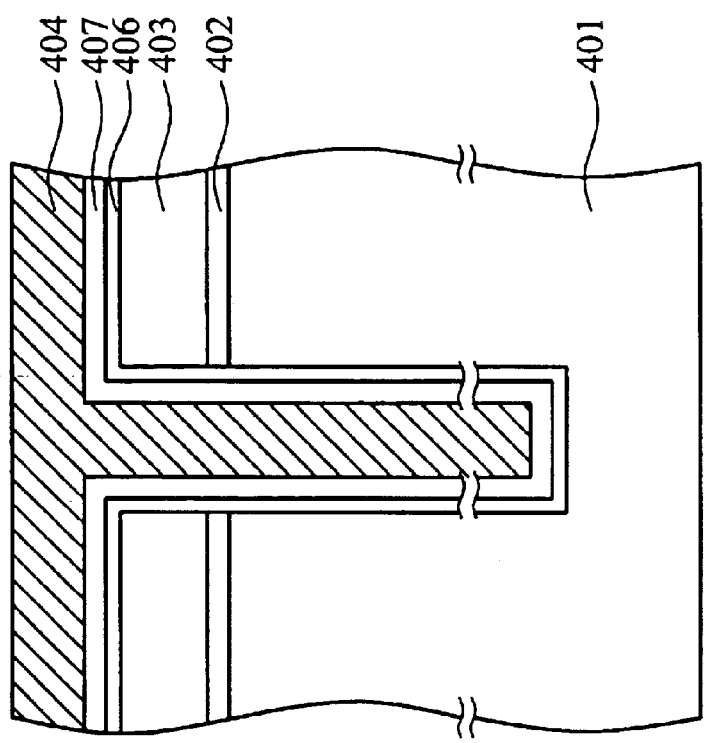
Figure 4C:
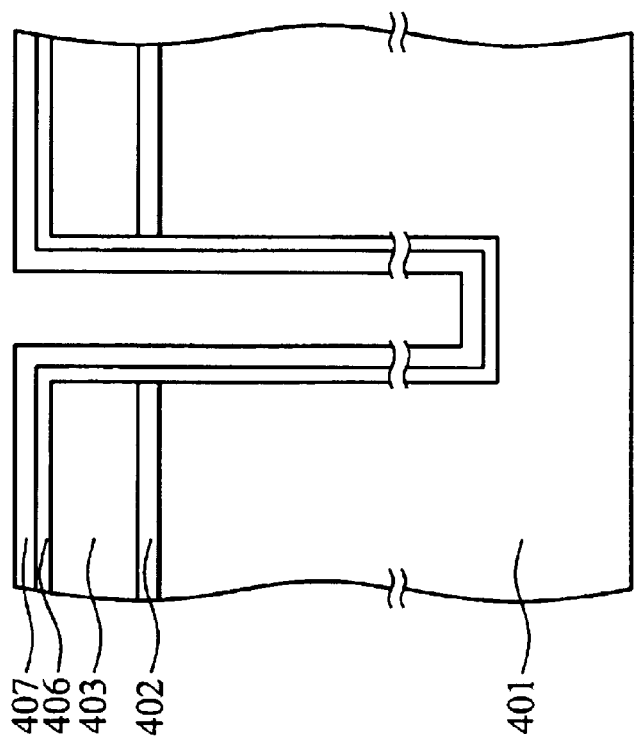

In FIG. 4c, a conformal first liner layer 406, such as oxide, and a conformal second liner layer 407, such as nitride, are all sequentially formed on the surface of the dielectric layer 403 and the trench 405a. The first liner layer 406 and the second liner layer 407 are formed by LPCVD or PECVD at 350 to 850° C. The thickness of the first liner layer 406 is about 50 to 2000. The thickness of the second liner layer 407 is about 50 to 2000.

In FIG. 4d, an insulating layer 408, such as spin-on glass or oxide or BSG or PSG, is formed on the surface of the second liner layer 407, filling the trench 405a.

Figure 4F:
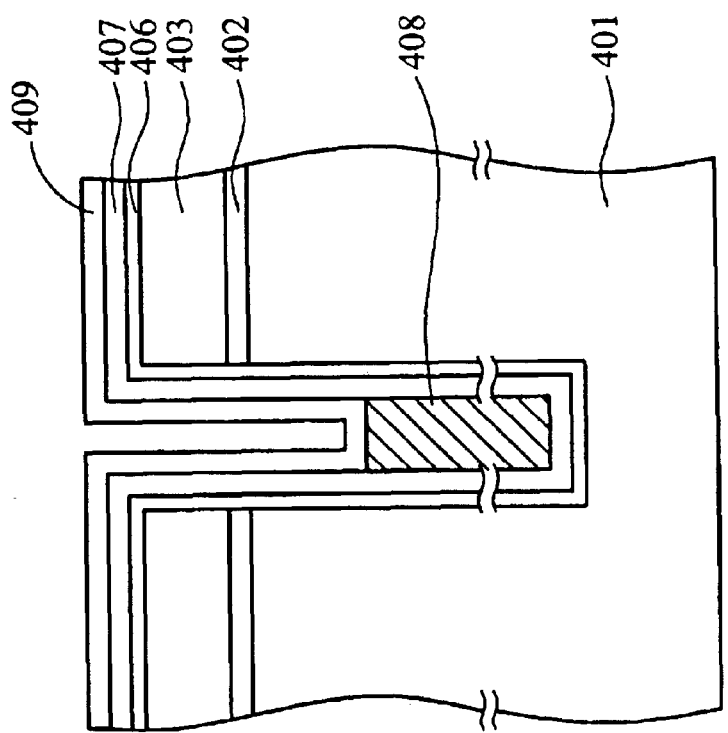
Figure 4E:
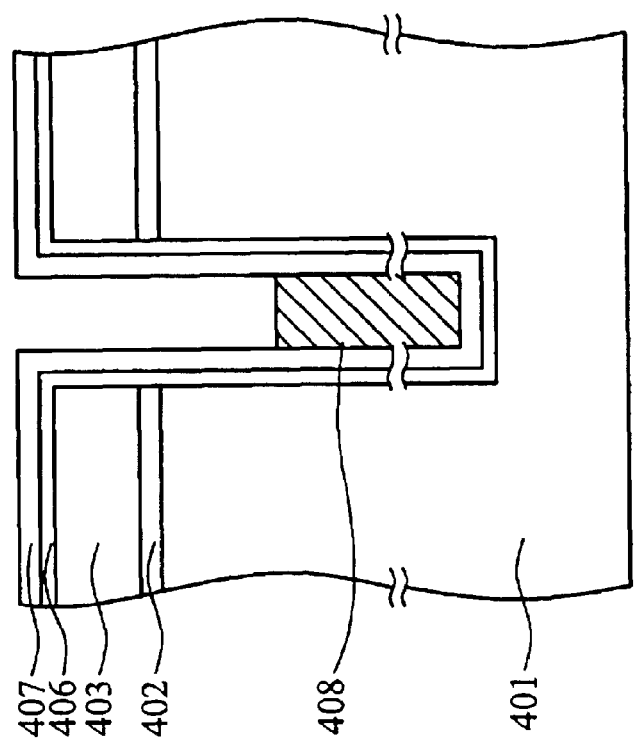

In FIG. 4e, the insulating layer 408 of the surface of the dielectric layer 403 is removed, and the insulating layer 408 in the trench 405a is etched to a predetermined depth of about 1 to 2 μm. The insulating layer 408 can be formed by anisotropic etching, such as reactive ion etching (RIE) or plasma etching, or isotropic etching, such as wet etching.

In FIG. 4f, a conducting layer 409, polysilicon or epitaxial or amorphous silicon, is conformally formed on the surface of the dielectric layer 403 and the trench 405a.

Figure 4H:
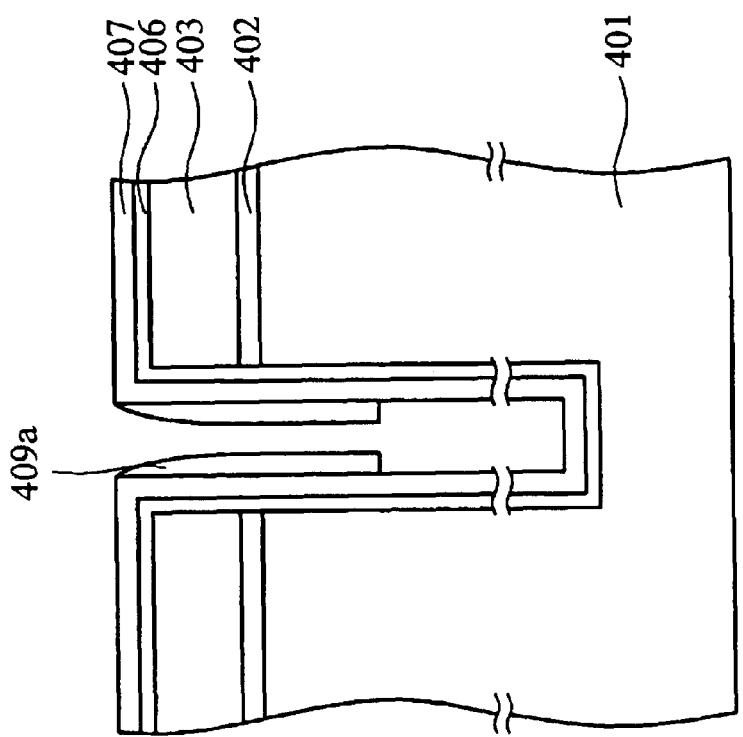
Figure 4G:
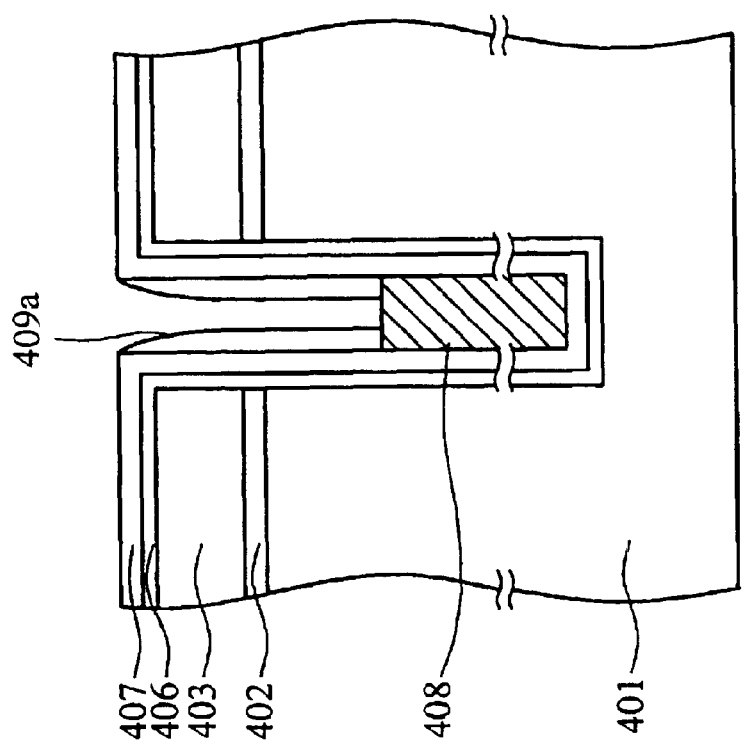

In FIG. 4g, the conducting layer 409 is anisotropically etched to form a spacer 409a on the sidewall of the trench 405a, such that the surface of the insulating layer 408 in the trench 405a is exposed. The dielectric layer 403 is not damaged because the dielectric layer 403 is covered by the conducting layer 409, the second liner layer 407, and the first liner layer 406, and the width of the opening of the trench 405a is not increased.

In FIG. 4h, the insulating layer 408 in the trench 405a is isotropically etched using the spacer 409a as a mask.

Figure 4J:
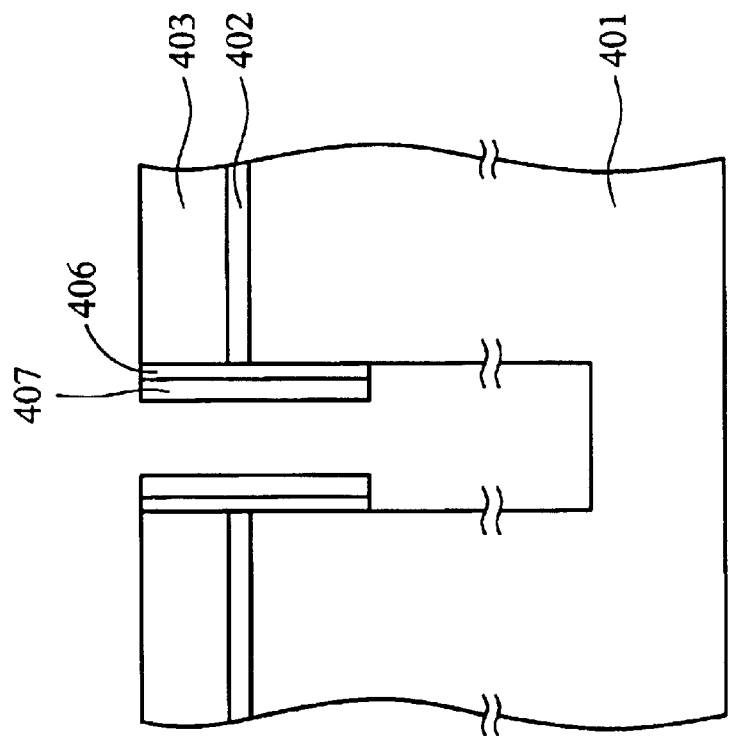
Figure 4I:
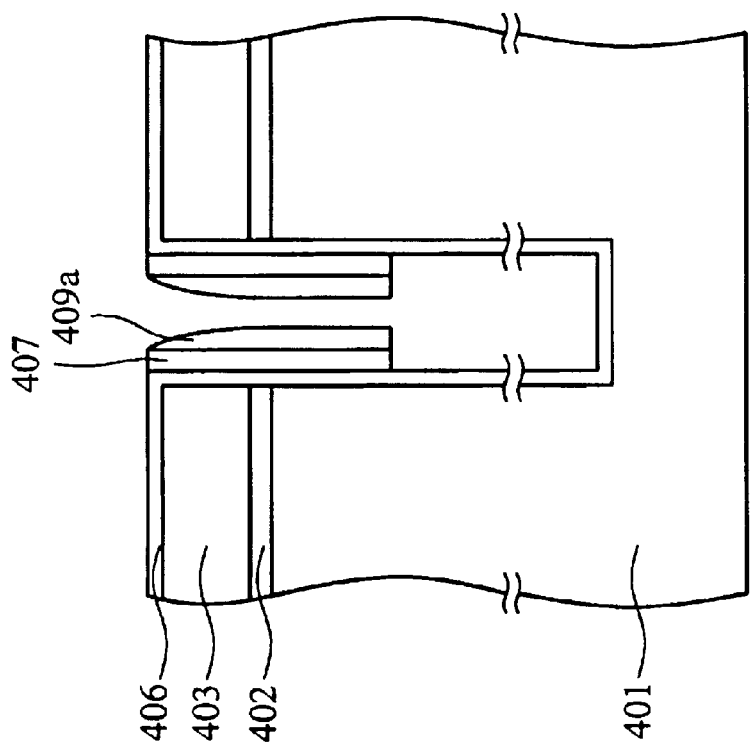

In FIG. 4i, the exposed second liner layer 407 is removed, as is the second liner layer 407 between the dielectric layer 403 and the first liner layer 406. The second liner layer 407, masked by the spacer 409a, is not removed.

In FIG. 4j, the exposed first liner layer 406 in the trench 405a is removed, as is the first liner layer 406 on the surface of the dielectric layer 403. The first liner layer 406 masked by the spacer 409a is not removed.

Finally, only the upper portion of the trench 405a is covered by the first liner layer 406 and the second liner layer 407.

Figure 4K:
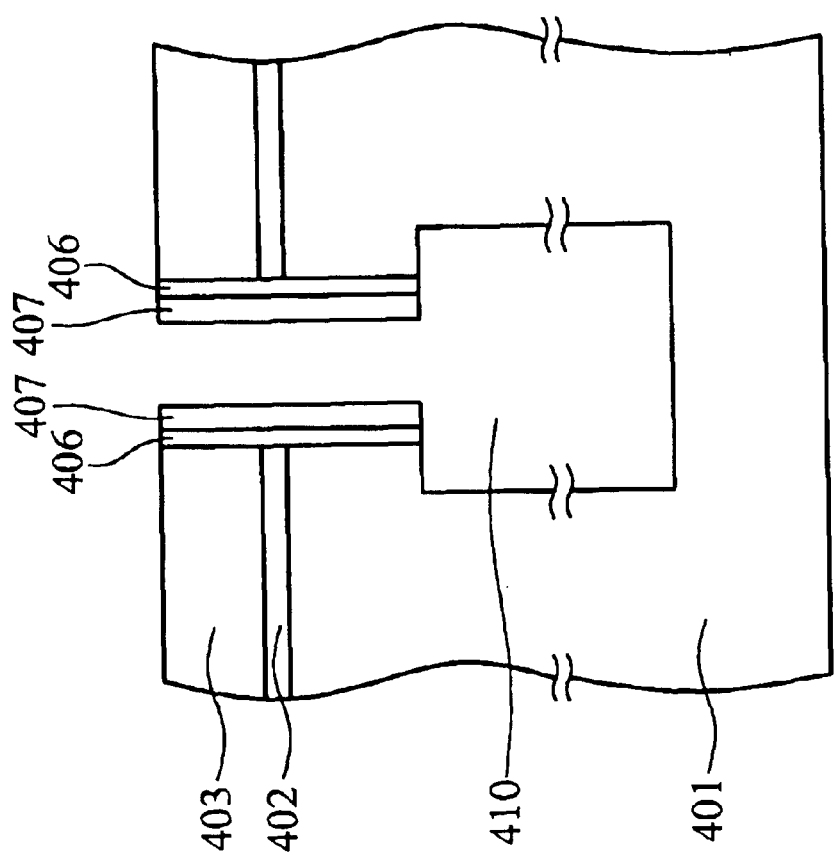

In FIG. 4k, the trench 405a, unmasked by the first liner layer 406 and the second liner layer 407, is isotropically etched to a bottle shape 410.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A process of forming a bottle-shaped trench comprising:

providing a semiconductor substrate, on the surface of which a pad layer, a hard mask layer, and a patterned insulating layer having an opening exposing the surface of the hard mask layer are all sequentially formed;

sequentially etching the hard mask layer, the pad layer, and the semiconductor substrate to form a trench using the patterned insulating layer as a mask;

removing the patterned insulating layer;

forming a spin-on glass layer on the hard mask layer, filling the trench without an interviewing layer between the semiconductor substrate and the spin-on glass layer;

anisotropically etching the spin-on glass in the trench to a predetermined depth, such that the spin-on glass on the surface of the hard mask layer is totally removed;

conformally forming an insulating layer on the surface of the hard mask layer and the trench;

anisotropically etching the insulating layer to form a spacer on the sidewall of the trench and exposing the surface of the spin-on glass;

wet etching the semiconductor substrate to remove the spin-on glass; and isotropically etching the trench, unmasked by the spacer, to a bottle shape.

2. The process of forming a bottle-shaped trench of claim 1, wherein the pad layer is an oxide layer.

3. The process of forming a bottle-shaped trench of claim 1, wherein the hard mask layer is silicon nitride or a combination layer of silicon nitride and borosilicate glass.

4. The process of forming a bottle-shaped trench of claim 1, wherein the insulating layer is a nitride layer.

5. The process of forming a bottle-shaped trench of claim 1, wherein the method of anisotropic etching is reactive ion etching or plasma etching.

6. The process of forming a bottle-shaped trench of claim 1, wherein the method of isotropic etching is wet etching.

7. A process of forming a bottle-shaped trench comprising:

providing a semiconductor substrate, on the surface of which a pad layer and a hard mask layer are sequentially formed, thereby forming a trench therein;

sequentially etching the hard mask layer, the pad layer, and the semiconductor substrate to form a trench using the patterned insulating layer as a mask;

removing the patterned insulating layer;

sequentially forming a conformal first liner layer and a conformal second liner layer;

forming a spin-on glass layer on the surface of the hard mask layer, such that the trench is filled with the spin-on glass;

etching the spin-on glass in the trench to a predetermined depth;

conformally forming a conducting layer on the surface of the trench and the spin-on glass layer;

anisotropically etching the conducting layer to form a spacer on the sidewall of the trench, exposing the surface of the spin-on glass;

wet etching the semiconductor substrate to remove the spin-on glass layer;

removing the exposed second liner layer;

removing the spacer and the exposed first liner layer; and etching the trench, unmasked by the first liner layer and the second liner layer, to a bottle shape.

8. The process of forming a bottle-shaped trench of claim 7, wherein the pad layer is an oxide layer.

9. The process of forming a bottle-shaped trench of claim 7, wherein the hard mask layer is a nitride layer.

10. The process of forming a bottle-shaped trench of claim 7, wherein the first liner layer is an oxide layer.

11. The process of forming a bottle-shaped trench of claim 7, wherein the second liner layer is a nitride layer.

12. The process of forming a bottle-shaped trench of claim 7, wherein the conducting layer is polysilicon, epitaxial silicon, or amorphous silicon.

* * * * *